(12) United States Patent
Ferianz et al.

(10) Patent No.: US 7,378,905 B2
(45) Date of Patent: May 27, 2008

(54) DIFFERENTIAL DRIVER CIRCUIT

(75) Inventors: Thomas Ferianz, Bodensdorf (AT); Ruediger Koban, Krumpendorf (AT)

(73) Assignee: Infineon Technologies AG, Munich (DE)

( * ) Notice: Subject to any disclaimer, the term of this patent is extended or adjusted under 35 U.S.C. 154(b) by 118 days.

(21) Appl. No.: 11/369,456

(22) Filed: Mar. 7, 2006

(65) Prior Publication Data
US 2006/0202753 A1    Sep. 14, 2006

(30) Foreign Application Priority Data
Mar. 8, 2005   (DE)   ...................... 10 2005 010 643

(51) Int. Cl.
*H03F 3/45*    (2006.01)
(52) U.S. Cl. ........................ 330/69; 330/260
(58) Field of Classification Search .................. 330/69, 330/124 R, 252, 253, 260, 295
See application file for complete search history.

(56) References Cited

U.S. PATENT DOCUMENTS 5,568,561 A * 10/1996 Whitlock .................... 330/69
6,259,322 B1 * 7/2001 Muza ....................... 330/257
6,693,486 B1 * 2/2004 Brockhaus .................. 330/69

FOREIGN PATENT DOCUMENTS

EP        0994610       4/2000

OTHER PUBLICATIONS

German Office Action dated Oct. 26, 2005.
Pierdomenico et al., "A 744mW Adaptive Supply Full-Rate ADSL CO Driver," *Digest of Technical Papers*, ISSCC 2002 IEEE International, vol. 1, No. 3-7, pp. 254-256 et al., Feb. 2002.

* cited by examiner

*Primary Examiner*—Khanh Van Nguyen
(74) *Attorney, Agent, or Firm*—Jenkins, Wilson, Taylor & Hunt, P.A.

(57) ABSTRACT

A current-saving differential wideband driver circuit comprises a differential input amplifier for amplifying a differential input signal to produce a differential intermediate signal being comprised of a first intermediate signal and a second intermediate signal, a first transimpedance amplifier comprising a first inverting input, a first non-inverting input, and a first output, and a second transimpedance amplifier comprising a second inverting input, a second non-inverting input, and a second output. The first intermediate signal is applied to the first non-inverting input, the first output is connected to the first inverting input of the first transimpedance amplifier via a first feedback resistor for negative current feedback, the second intermediate signal is applied to the second non-inverting input, and the second output is connected to the second inverting input of the second transimpedance amplifier via a second feedback resistor for negative current feedback. The differential wideband driver circuit further comprises a third feedback resistor connected between the first and second inverting inputs for setting a gain factor for the wideband driver circuit and an amplified differential output signal is present at the first and second outputs.

14 Claims, 3 Drawing Sheets

DIFFERENTIAL DRIVER CIRCUIT

BACKGROUND OF THE INVENTION

1. Field of the Invention

The present invention relates to a differential driver circuit which can be used particularly as a line driver circuit for the data transmission by two-wire telephone lines on the basis of an XDSL method.

2. Description of the Prior Art

Driver circuits for XDSL applications are subjected to particularly high linearity and bandwidth demands in order to transmit a large volume of data at a low error rate over two-wire telephone lines. To this end, known circuit arrangements for operational amplifiers, as described in U. Tietze, Ch. Schenk, Halbleiterschaltungstechnik [semiconductor circuitry], Springer Verlag, Heidelberg, ISBN 3-540-42849-6, for example, are frequently produced using fast complementary bipolar technologies and BiCMOS technologies.

One particular challenge is to ensure that the respective power loss of driver circuits which drive differential data signals which are to be amplified into a two-wire telephone line is low. This is particularly difficult for XDSL signals which are to be transmitted, since their crest factor of typically 5.2 to 6.8 is relatively high.

The crest factor denotes the peak value of a waveform, divided by the RMS voltage of the waveform. The RMS voltage or the RMS value is that DC voltage which draws the same power in a load as the (irregular) AC voltage waveform. By way of example, a sinusoidal AC voltage signal has a crest factor of $\sqrt{2}\approx 1.4$. Since XDSL signals have AC voltages of up to 30 MHz and a very irregular waveform, their crest factor is correspondingly high.

An appropriate driver circuit for xDSL signals therefore needs to be designed such that peak values which occur in the data signal to be amplified are also reliably amplified. This means that, in the case of line drivers with amplifier stages of type A for example, a respective bias current for the amplifier stages needs to be chosen to be of a magnitude such that peak values which occur, which may also occur just with a very low probability of approximately $10^{-7}$, can reliably be output in amplified form. A constant bias current provided at such a level therefore results in an undesirably high power loss in the driver circuit.

Proposals have been made in the past to reduce the power loss, such as in "A 744 mW Adaptive Supply Full-Rate ADSL CO Driver", ISSCC 2002, J. W. Pierdomenico, S. Wurcer, B. Day. This document proposed increasing the required operating voltage for the amplifier stages or operational amplifiers used when necessary, that is to say when peak values of the signal to be transmitted occur.

An appropriate circuit arrangement based on the prior art is shown in FIG. 3. The circuit arrangement LD is used to amplify a differential input signal IN+, IN− to produce a differential output signal OUT+, OUT−. This is done by providing two driver amplifiers DA1, DA2, each having an inverting and a non-inverting input N, NI and an output A. The respective outputs A are connected to the respective non-inverting inputs N via feedback resistors R1, R3. In addition, a third feedback resistor R2 is connected between the non-inverting inputs N.

The non-inverting inputs NI are supplied with the respective signals IN+, IN− of the differential input signal IN+, IN−. In addition, the two driver amplifiers DA1 each have supply voltage connections V1, V2, to which supply voltage potentials VCCP, VEEP are applied. The supply voltage potentials VCCP, VEEP are delivered by a peak voltage supply SOP, which itself is coupled to standard supply voltages VCC, VEE. In this case, the standard supply voltage VCC, VEE is based on VCC=6V, VEE=−6 V, for example. In addition, the peak voltage supply SOP is supplied with the differential input signal IN+, IN−.

The peak voltage supply SOP monitors whether voltage spikes arise in the input signal IN+, IN−. If this is the case, the peak voltage supply produces supply voltage potentials VCCP, VEEP which are increased over the standard supply voltages VCC, VEE and which are supplied to the driver amplifiers DA1, DA2. This ensures that signal peak values are also reliably transmitted to the differential output signal OUT+, OUT−. To provide the increased supply voltage VCCP, VEEP, the peak voltage supply SOP contains charge pumps. A drawback of the circuit based on the prior art which is shown in FIG. 3 is, in particular, the increased circuit complexity as a result of the peak voltage supply SOP and disregarded linearity demands.

Another problem when amplifying xDSL signals is that the fastest signal transients occur at the time of a peak value. At each internal line node, for example at the inputs of operational amplifiers, parasitic capacitances arise, depending on production, which are usually non-linear. This means that signal distortions are produced for high internal voltage and signal swings on account of these non-linearities.

SUMMARY OF THE INVENTION

It is an object of the present invention to provide a differential driver circuit which has a low power loss and has a relative low internal signal swings.

The object is achieved in accordance with the invention by means of a differential driver circuit, comprising a differential input amplifier for amplifying a differential input signal to produce a first intermediate signal and a second intermediate signal of the differential intermediate signal, a first transimpedance amplifier having an inverting input, a non-inverting input and an output, with the first intermediate signal being applied to the non-inverting input, and the output being connected to the inverting input of the first transimpedance amplifier via a first feedback resistor for negative current feedback, a second transimpedance amplifier having an inverting input, a non-inverting input and an output, with the second intermediate signal being applied to the non-inverting input, and the output being connected to the inverting input of the second transimpedance amplifier via a first feedback resistor for negative current feedback, and a third feedback resistor connected between the inverting outputs of the first and second transimpedance amplifiers for setting the gain factor for the wideband driver circuit. An amplified differential output signal can be tapped off at the outputs of the two transimpedance amplifiers.

An underlying idea of the invention is, in particular, to combine transimpedance amplifiers operated as an output driver stage using negative current feedback with a differential input amplifier. The negative current feedback to the non-inverting inputs means that the proportioning of the feedback resistors allows their gain factor to be set without loss of bandwidth. In the case of normal amplifier stages with negative voltage feedback, however, the bandwidth becomes smaller. The transimpedance amplifiers with negative current feedback which are used by the invention therefore allow the signal swing between the first and second intermediate signals to be kept particularly low.

A respective input buffer amplifier for driving the first and second intermediate signals may be connected upstream of the non-inverting input of the first transimpedance amplifier and the non-inverting input of the second transimpedance amplifier.

A respective output buffer amplifier for driving the output signal may be connected downstream of the output of the first transimpedance amplifier and the output of the second transimpedance amplifier. Appropriate buffer amplifiers increase the possible output current level of the wideband driver circuit. In this case, it is particularly advantageous if the input and/or output buffer amplifiers have a gain factor of unity. The use of buffer amplifiers allows even particularly large loads to be driven on a two-wire line connected to the outputs of the circuit. In this case, the input buffer amplifiers are used to actuate the transimpedance amplifiers.

In a restricted version of the inventive circuit, for the purpose of negative voltage feedback, a first further feedback resistor is connected between the output of the second transimpedance amplifier and a non-inverting input of the differential input amplifier, and a second further feedback resistor is connected between the output of the first transimpedance amplifier and an inverting input of the differential input amplifier. Using this negative voltage feedback and possibly further feedback and synthesizing resistors, a further external control loop—besides the control loop constructed from the negative current feedback—is implemented to set the gain of the differential input amplifier. This has the advantage that aligning the feedback resistors allows the gain factor of the overall wideband driver circuit to be set, with the first, second and third feedback resistors being used to set the gain of the transimpedance amplifiers, and hence the signal swings present at the outputs of the differential input amplifier being able to be advantageously set and reduced. In addition, it is possible to synthesize the output impedance of the wideband driver circuit using such a resistor network.

Parasitic non-linear capacitors may be provided at outputs of the differential input amplifier. It is then particularly advantageous that the feedback resistors for setting the gain of the wideband driver circuit are proportioned such that the voltage swing in the differential intermediate signal is essentially lower than the voltage swing in a supply voltage for the wideband driver circuit. This inventive measure achieves a particularly linear wideband driver circuit over a wide modulation range and a wide frequency bandwidth.

A dynamic bias control device may be provided which takes the differential output signal as a basis for controlling a bias current for the first and/or second transimpedance amplifier(s). In this case, it is of particular advantage if the bias control device is coupled by means of coupling capacitors to the outputs of the two transimpedance amplifiers, with the bias control device increasing the bias currents for the two transimpedance amplifiers in the event of a rising voltage swing in the differential output signal from the wideband driver circuit. The bias control device therefore makes it possible, while there are no input signal peak values which need to be transmitted by the wideband driver circuit, for the relevant bias currents for the transimpedance amplifiers to have a relatively low value. As soon as the bias control device identifies a rising voltage swing, however, the bias currents are increased in order to ensure that the peak value of the input signal is therefore also reliably transmitted or driven. The bias control device therefore results in improved power loss for the overall wideband driver circuit.

The differential input amplifier may be in the form of a type-AB amplifier. Particularly the combination of a type-AB amplifier with the transimpedance amplifiers with negative current feedback provides a wideband driver circuit whose power consumption is particularly low for a high signal bandwidth and which exhibits a particularly linear signal response.

The feedback resistors may be proportioned such that the synthesized output impedance of the wideband driver circuit is essentially the impedance of the load connected to the outputs, particularly 100 ohms. With a 56-ohm output impedance, for example, a standard 4:3 input transformer can be used to transmit signals on 100-ohm two-wire lines.

The first, second and third feedback resistors may be proportioned such that the gain factor of the differential amplification stage comprising the two transimpedance amplifiers is greater than unity. Such proportioning allows a particularly low signal swing in the differential intermediate signal on account of the negative current feedback, which means that any parasitic capacitances have a less critical effect on the linearity of the wideband driver circuit.

The inventive driver circuit may preferably be in fully integrated form in order to rule out AC stability problems as far as possible.

DESCRIPTION OF THE FIGS.

Figure 3:
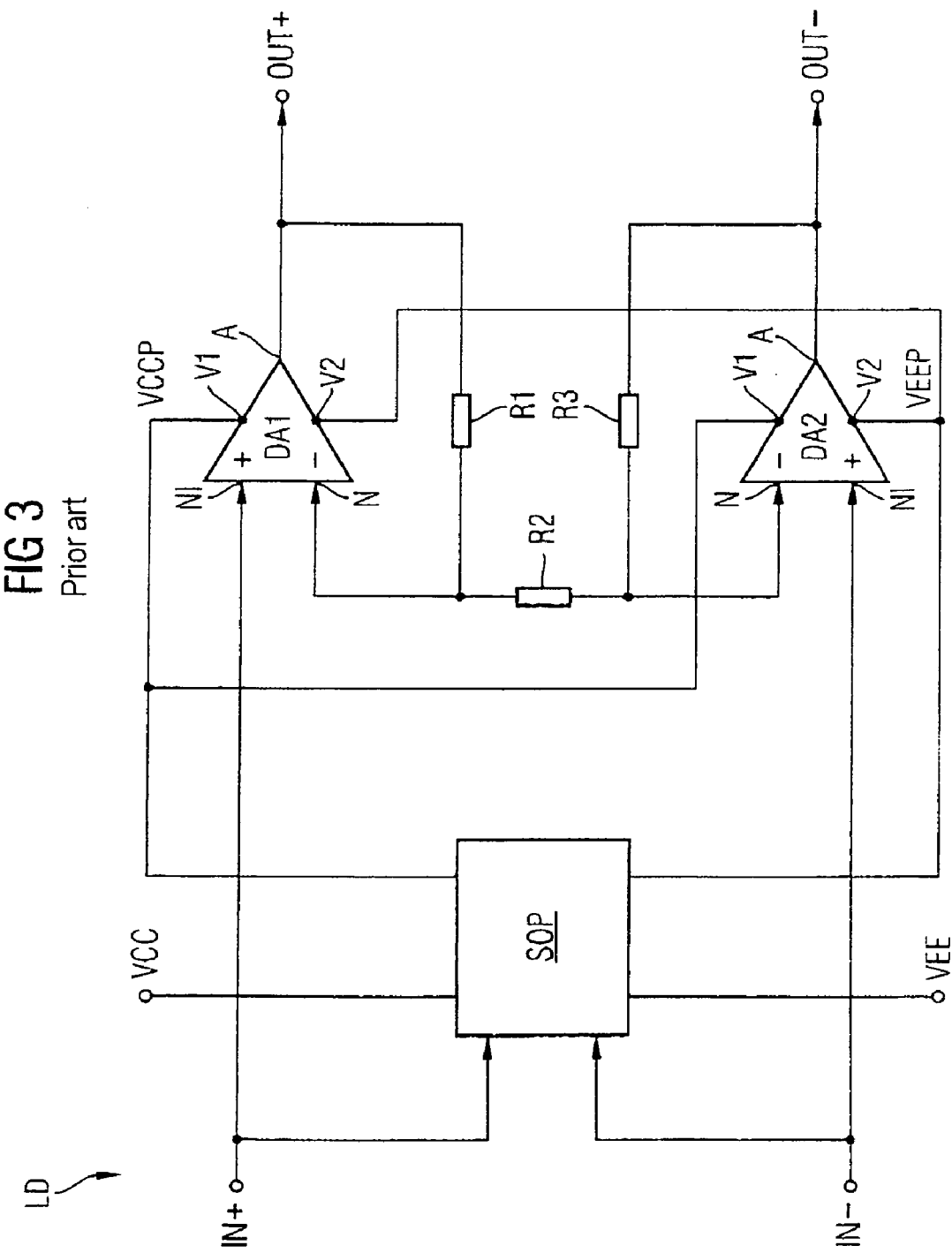

FIG. 3, as discussed above, is a driver circuit based on the prior art.

DESCRIPTION OF THE PREFERRED EMBODIMENTS

Unless otherwise stated, elements which have the same function have been provided with the same reference symbols in the figures.

Figure 1:
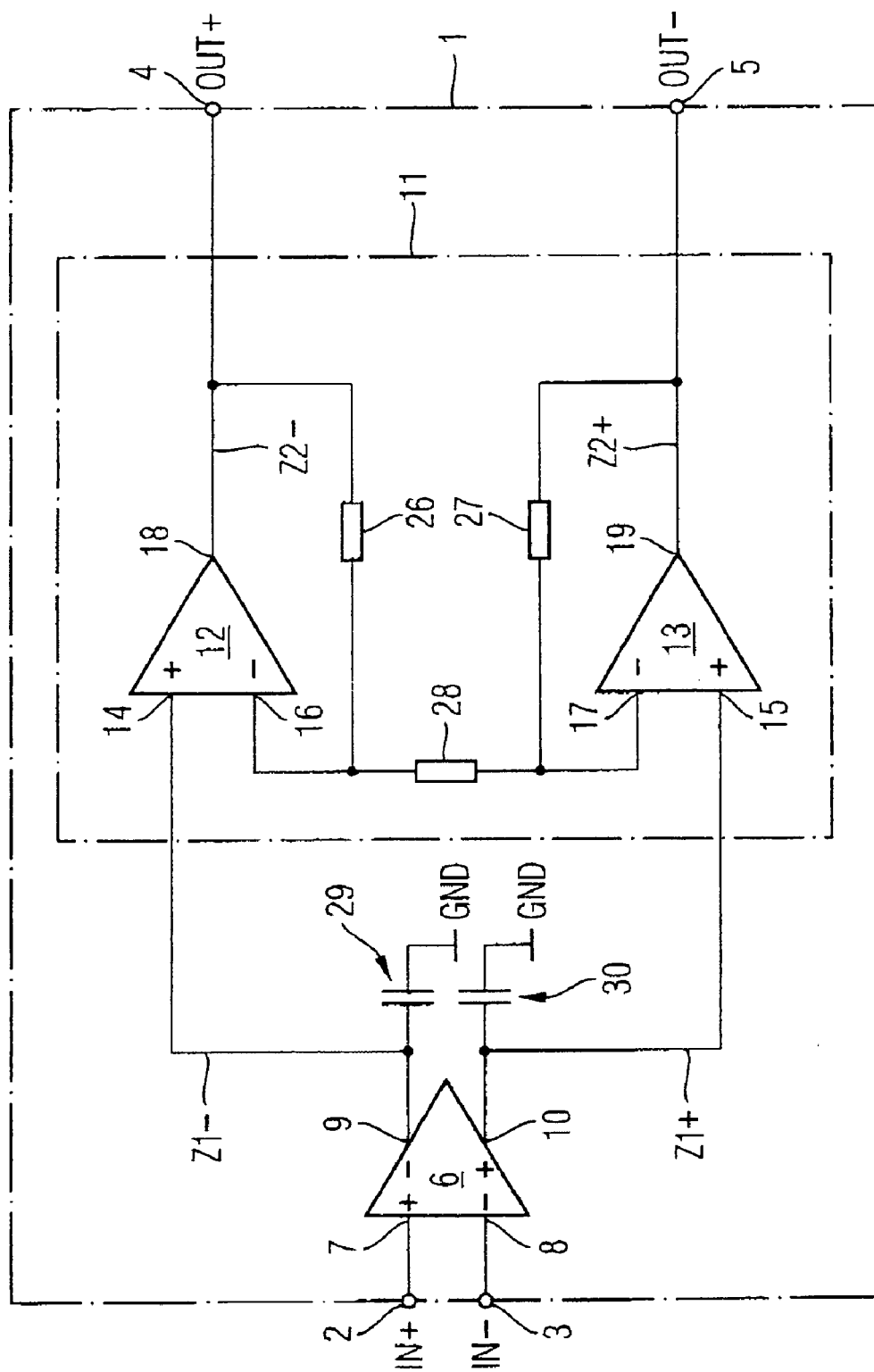
FIG. 1 is a block diagram of a first exemplary embodiment of an inventive wideband driver circuit.

FIG. 1 shows a current-saving differential wideband driver circuit 1 based on the invention. The wideband driver circuit 1 has a pair of inputs 2, 3 for inputting a differential input signal IN+, IN− and a pair of outputs 4, 5 for outputting a driven differential output signal OUT+, OUT−.

A differential input amplifier 6 having a non-inverting input 7, an inverting input 8, an inverting output 9 and a non-inverting output 10 is provided, with a first input signal IN+ being supplied to the non-inverting input 7 and a second input signal IN− of the differential input signal IN+, IN− being supplied to the inverting input 8. The input amplifier is preferably in the form of a class-AB amplifier, which is particularly current-saving, since the quiescent current or bias current is reduced in comparison with class-A amplifiers, for example.

A second amplifier stage 11 having a first transimpedance amplifier 12 and a second transimpedance amplifier 13 is provided. The transimpedance amplifiers 12, 13 each have a non-inverting input 14, 15 and an inverting input 16, 17 and also an output 18, 19. The outputs 18, 19 of the two transimpedance amplifiers 12, 13 are respectively connected to the outputs 4, 5 of the wideband driver circuit 1.

A first feedback resistor 26 is connected between the output 24 of the first output buffer amplifier 20 and the non-inverting input 16 of the first transimpedance amplifier 12. A second feedback resistor 27 is connected between the output 25 of the second output buffer amplifier 21 and the non-inverting input 17 of the second transimpedance amplifier 13. In addition, a third feedback resistor is connected between the non-inverting inputs 16, 17 of the two transimpedance amplifiers 12, 13. In this case, the ratio of the resistance value of the equally proportioned first and second feedback resistors 26, 27 to the resistance value of the third feedback resistor 28 determines the gain factor.

The inverting output 9 of the differential input amplifier 6 is connected to the non-inverting input 14 of the first transimpedance amplifier 12. The non-inverting output 10 of the differential input amplifier 6 is connected to the non-inverting input 15 of the second transimpedance amplifier 13. Parasitic capacitances, which in this case are shown as capacitors 29, 30, are present at the outputs 9, 10 of the differential input amplifier 6. By way of example, the capacitances may be caused by depletion-layer capacitances, whose non-linear properties increase the closer an applied potential is to a supply voltage potential for the respective integrated chip. Voltage swings in the intermediate signal Z1+, Z1− which are significantly lower than a supply voltage swing are therefore desirable.

The two outputs 9, 10 of the differential input amplifier 6 are therefore connected to earth GND via these non-linear capacitors 29, 30.

The overall wideband driver circuit 1 can be in fully integrated form, with particularly the internally integrated embodiment of the feedback resistors 26, 27, 28 then hardly being able to cause stability problems in the high-frequency range.

The differential input amplifier 6 provided as a class-AB amplifier in this case can be supplied with a particularly low bias current (not shown here), like the transimpedance amplifiers 12, 13. Setting the gain using the negative current feedback control loop allows a significantly greater bandwidth in comparison with amplifier arrangements which have negative voltage feedback. In addition, amplification stages 11 with negative current feedback require merely a relatively small input signal voltage swing, that is to say a signal swing in the intermediate signals Z1−, Z1+. This in turn has an advantageous effect on possible negative influences by the non-linear parasitic capacitances 29, 30. The signal swing in the intermediate signals Z1−, Z1+ which is produced by the differential input amplifier 6 can therefore be set to be low, which produces a particularly linear gain for the wideband driver circuit 1 overall.

Figure 2:
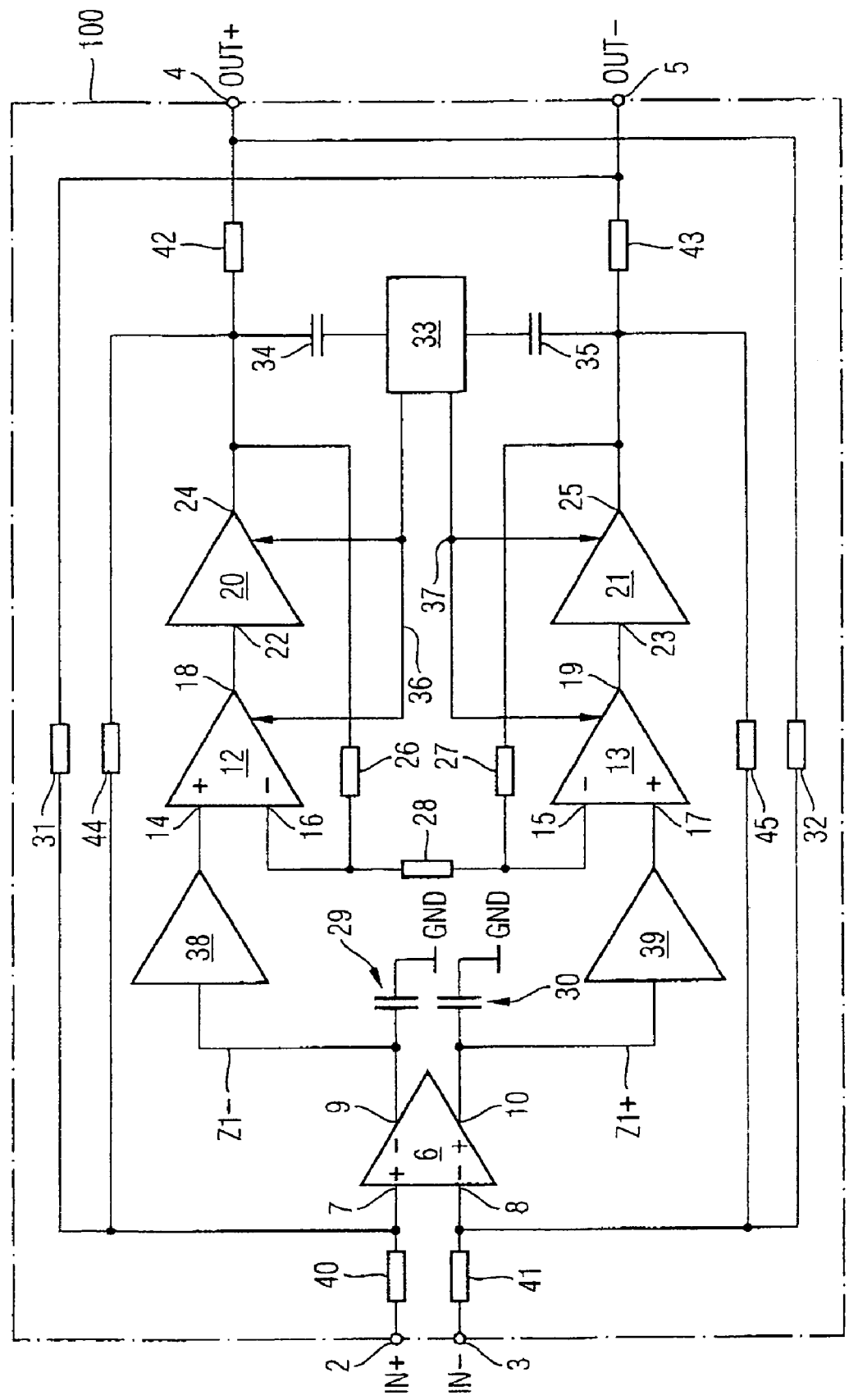
FIG. 2 is a block diagram of a second exemplary embodiment of an inventive wideband driver circuit.

FIG. 2 shows a development of the wideband driver circuit 100 based on the invention.

The development of the wideband driver circuit 100 has essentially the same elements as the wideband driver circuit 1 shown in FIG. 1, with the outputs 18, 19 of the transimpedance amplifiers 12, 13 having a respective output buffer amplifier 20, 21 connected downstream of them. The output buffer amplifiers 20, 21 each have an input 22, 23 and an output 24, 25, and the outputs 24, 25 are connected to the outputs 4, 5 of the wideband driver circuit 1.

The input signal IN+, IN− is supplied to the differential input amplifier via input resistors 40, 41, which are connected between the inputs 2, 3 of the wideband driver 100 and the inputs 7, 8 of the differential input amplifier 6.

In addition, a first synthesizing resistor 42 is connected between the output 24 of the first output buffer amplifier 20 and the first output 4 of the circuit arrangement 100, and a second synthesizing resistor 43 is connected between the output 25 of the second output buffer amplifier 21 and the second output 5 of the circuit arrangement 100.

A first further feedback resistor 31 is connected between the non-inverting input 7 of the input amplifier 6 and the second output 5 of the circuit 100, and a second further feedback resistor 32 is connected between the inverting input 8 of the differential input amplifier 6 and the first output 4 of the wideband driver circuit 100. A third and a fourth further feedback resistor 44, 45 are connected between the output 24 of the first output buffer amplifier 20 and the non-inverting input 7 of the input amplifier 6 and between the output 25 of the second output buffer amplifier 21 and the inverting input 8 of the input amplifier 6. The synthesizing and feedback resistors determine the impedance of the wideband driver circuit 100.

In addition, a dynamic bias control device 33 is provided which is coupled to the outputs 24, 25 of the first output buffer amplifier 20 and of the second output buffer amplifier 21 via a first and a second coupling capacitor 34, 35. The dynamic bias control device 33 is therefore capacitively coupled to the output signals OUT+, OUT− from the wideband driver circuit 100.

The dynamic control device 35 uses suitable control signals 36, 37 to control the bias currents for the transimpedance amplifiers 12, 13 and optionally the corresponding bias currents for the output buffer amplifiers 20, 21. This is done such that the relevant bias current for the transimpedance amplifiers 12, 13 is increased for particularly large signal swings or rapidly rising output signals OUT+ and OUT−. This ensures that in normal operation, that is to say in time periods in which the differential input signal IN+, IN− has a lower crest factor, a relatively low bias current is controlled for the transimpedance amplifiers 12, 13. This further reduces the power consumption of the wideband driver circuit 100.

The two further feedback resistors 31, 32 are used to produce an external control loop, which determines the gain factor for the wideband driver circuit.

In the development of the wideband driver circuit 100, an input buffer amplifier 38, 39 is also respectively connected between the inverting output 9 of the input amplifier 6 and the non-inverting input 14 of the first transimpedance amplifier 12 and between the non-inverting output 10 of the differential input amplifier 6 and the non-inverting input 17 of the second transimpedance amplifier 13. The two (optional) input buffer amplifiers 38, 39 are used for improved actuation of the transimpedance amplifiers 12, 13.

In line with the invention, two control loops are therefore nested in one another. First, the high-impedance outputs 18, 19 of the transimpedance amplifiers 12, 13 with negative current feedback also mean that these amplifiers provide a current-saving gain for the intermediate signals Z1−, Z1+, which are also required to have only a small voltage or signal swing. The further control loop using the further feedback resistors 31, 32, which are used for negative voltage feedback, ultimately stipulates the gain factor for the wideband driver circuit 100 together with the gain factors which have been set for the transimpedance amplifiers 12, 13.

The inventive wideband driver circuit 1, 100 allows its output impedance to be favourably matched by means of the proportioning of the feedback resistors 26, 28, 27, 31, 32, and the use of class-AB differential input amplifiers 6 means that it has a low power loss and good linearity properties, since setting the negative current feedback for the transimpedance amplifiers 12, 13 demands only a small signal swing from the intermediate signal Z1−, Z1+ from the input amplifier 6. The inventive wideband driver circuit is therefore outstandingly suitable for use in XDSL systems, which require a signal bandwidth of up to 30 MHz and, inter alia, need to drive 100-ohm line impedance. The wideband driver circuit 1, 100 can therefore be used for signals to be driven which have a high crest factor.

Although modifications and changes may be suggested by those skilled in the art, it is the intention of the inventors to embody within the patent warranted heron all change and modifications as reasonably and properly come within the scope of their contribution to the art.

We claim as our invention:

1. A differential driver circuit, comprising:
   a differential input amplifier for amplifying a differential input signal to produce a differential intermediate signal being comprised of a first intermediate signal and a second intermediate signal;
   a first transimpedance amplifier comprising a first inverting input, a first non-inverting input, and a first output; said first intermediate signal being applied to said first non-inverting input and said first output being connected to said first inverting input of said first transimpedance amplifier via a first feedback resistor for negative current feedback;
   a second transimpedance amplifier comprising a second inverting input, a second non-inverting input, and a second output; said second intermediate signal being applied to said second non-inverting input and said second output being connected to said second inverting input of said second transimpedance amplifier via a second feedback resistor for negative current feedback;
   a third feedback resistor connected between said first and second inverting inputs for setting a gain factor of said driver circuit; an amplified differential output signal being present at said first and second outputs;
   a fourth feedback resistor connected between said second output of said second transimpedance amplifier and a non-inverting input of said differential input amplifier; and
   a fifth feedback resistor connected between said first output of said first transimpedance amplifier and an inverting input of said differential input amplifier.

2. The circuit of claim 1, comprising a first input buffer amplifier connected upstream of said first transimpedance amplifier and driving said first intermediate signal, and a second input buffer amplifier connected upstream of said second transimpedance amplifier and driving said second intermediate signal.

3. The circuit of claim 2, wherein said first and second input buffer amplifiers have a gain factor of unity.

4. The circuit of claim 1, comprising a first output buffer amplifier connected downstream of said first output and a second output buffer amplifier connected downstream of said second output; said amplified differential output signal being comprised of a first output signal and a second output signal, said first output buffer amplifier driving said first output signal and said second output buffer amplifier driving said second output signal.

5. The circuit of claim 4, wherein said first and second output buffer amplifiers have a gain factor of unity.

6. The circuit of claim 1, comprising parasitic non-linear capacitors at outputs of said differential input amplifier; said capacitors having non-linear capacitances.

7. The circuit of claim 1, wherein said first and second feedback resistors for setting the gain of said driver circuit are proportioned such that the voltage swing in said differential intermediate signal is lower than a voltage swing of respective supply voltages.

8. The circuit of claim 1, comprising a dynamic bias control device taking said amplified differential output signal as a basis for controlling at least one of a bias current for said first or said second transimpedance amplifiers.

9. The circuit of claim 8, wherein said bias control device is coupled by means of coupling capacitors to said first and second outputs and increases said bias currents for said first and second transimpedance amplifiers if a voltage swing in said amplified differential output signal increases.

10. The circuit of claim 1, wherein said differential input amplifier is a type-AB amplifier.

11. The circuit of claim 1, being an integrated circuit.

12. The circuit of claim 1, wherein said first, second, and third feedback resistors are proportioned such that a synthesized output impedance of said driver circuit is approximately 100 ohms.

13. The circuit of claim 1, wherein said first, second, third, fourth, and fifth feedback resistors are proportioned such that a synthesized output impedance of said driver circuit is approximately 100 ohms.

14. The circuit of claim 1, wherein said first, second, and third feedback resistors are proportioned such that the gain factor of a differential amplification stage comprising said first and second transimpedance amplifiers is greater than unity.

* * * * *